United States Patent
Liu et al.

(10) Patent No.: US 9,753,371 B2
(45) Date of Patent: Sep. 5, 2017

(54) EDGE BEAD REMOVAL APPARATUS

(71) Applicant: Semiconductor Manufacturing International (Shanghai) Corporation, Shanghai (CN)

(72) Inventors: Yang Liu, Shanghai (CN); Qiang Wu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/369,075

(22) Filed: Dec. 5, 2016

(65) Prior Publication Data

US 2017/0082924 A1    Mar. 23, 2017

Related U.S. Application Data

(62) Division of application No. 14/177,346, filed on Feb. 11, 2014, now Pat. No. 9,548,225.

(30) Foreign Application Priority Data

Jun. 5, 2013  (CN) .......................... 2013 1 0222206

(51) Int. Cl.
| | | |
|---|---|---|
| *B08B 3/02* | (2006.01) | |
| *B08B 3/08* | (2006.01) | |
| *B08B 5/02* | (2006.01) | |
| *G03F 7/42* | (2006.01) | |
| *H01L 21/02* | (2006.01) | |
| *H01L 21/67* | (2006.01) | |
| *B08B 3/04* | (2006.01) | |
| *F26B 21/00* | (2006.01) | |

(52) U.S. Cl.
CPC .................. *G03F 7/42* (2013.01); *B08B 3/02* (2013.01); *B08B 3/04* (2013.01); *B08B 3/08* (2013.01); *B08B 5/02* (2013.01); *F26B 21/004* (2013.01); *H01L 21/02041* (2013.01); *H01L 21/02057* (2013.01); *H01L 21/02087* (2013.01); *H01L 21/6708* (2013.01); *H01L 21/67017* (2013.01); *H01L 21/67051* (2013.01)

(58) Field of Classification Search
CPC .... B08B 3/02; B08B 3/08; B08B 5/02; G03F 7/42; H01L 21/02041; H01L 21/67051
USPC .......................... 118/500, 503; 134/198, 902
See application file for complete search history.

(56) References Cited

U.S. PATENT DOCUMENTS

| | | |
|---|---|---|
| 5,364,474 A | 11/1994 | Williford, Jr. |
| 2004/0206452 A1 | 10/2004 | Okuda et al. |
| 2005/0107274 A1 | 5/2005 | Daviot |
| 2008/0047580 A1 | 2/2008 | Kim et al. |
| 2010/0206338 A1* | 8/2010 | Kraus ............... H01L 21/67034 134/30 |
| 2011/0163065 A1 | 7/2011 | Verhaverbeke et al. |

* cited by examiner

*Primary Examiner* — Michael Barr
*Assistant Examiner* — Levon J Shahinian
(74) *Attorney, Agent, or Firm* — Anova Law Group, PLLC

(57) ABSTRACT

An edge bead removal apparatus is provided. The edge bead removal apparatus includes a clamping unit configured to clamp a cylindrical reticle and cause the cylindrical reticle to incline with a pre-determined angle and to rotate around a central axis. The edge bead removal apparatus also includes an edge bead removal solvent nozzle configured to spray an edge bead removal solvent to remove edge beads on both edges of the cylindrical reticle.

13 Claims, 6 Drawing Sheets

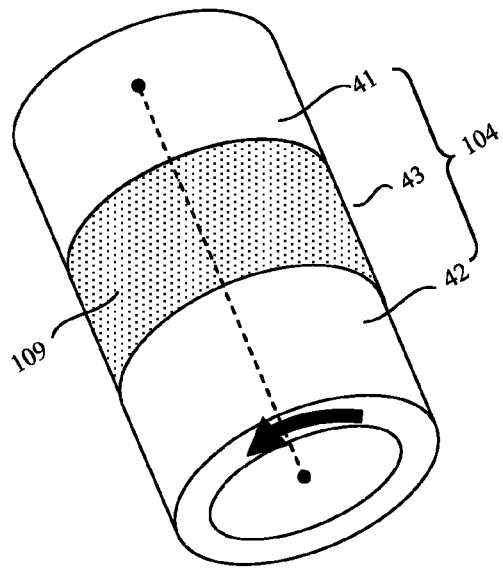

FIG. 11

S101
Providing a cylindrical reticle having a formed photoresist layer; and transferring the cylindrical reticle into a edge bead removal apparatus S102
Moving the cylindrical reticle close to an edge bead removal solvent nozzle; and inclining the cylindrical reticle to a pre-determined angle S103
Removing the photoresist layer on an edge of a first non-imaging area and a first side surface of the cylindrical reticle S104
Removing residue edge bead removal solvent

FIG. 12

EDGE BEAD REMOVAL APPARATUS

CROSS REFERENCE TO RELATED APPLICATIONS

This application is a divisional of U.S. patent application Ser. No. 14/177,346, filed on Feb. 11, 2014, which claims the priority of Chinese patent application No. 201310222206.4, filed on Jun. 5, 2013, the entirety of all of which is incorporated herein by reference.

FIELD OF THE INVENTION

The present invention generally relates to the field of semiconductor manufacturing technology and, more particularly, relates to edge bead removal apparatus and edge bead removal methods thereof.

BACKGROUND

A photolithography process, transferring patterns on a mask to a substrate by an exposure process, is a important process of the semiconductor manufacturing technology. The photolithography process is a core step in the manufacturing of large scale integrations (LSIs). The complex and time-consuming photolithography processes of the semiconductor manufacturing are mainly performed by corresponding exposure apparatus. Further, the development of the photolithography technology or the improvement of the exposure apparatus are mainly focused on three factors: feature size, overlay resolution, and yield.

In the manufacturing of a semiconductor device, the photolithography process may include three main steps: changing wafers on the wafer stages; aligning the wafers on the wafer stages; and transferring patterns on the mask to the wafers. These three steps may be sequentially repeated on the same wafer stage.

Since the photolithography process is a key step of the semiconductor manufacturing process, how to improve the yield of an exposure apparatus in the practical manufacturing process has become a very important topic. Various exposure apparatus with twin-stages have been developed in past a few years in order to further increase the yield of the exposure apparatuses. The exposure apparatus with twin-stages may refer that when one wafer stage is performing an exposure, the other wafer stage may perform wafer alignment simultaneously, thus the wafer waiting time may be reduced; and the exposure efficiency of the exposure apparatus may be improved.

Another more advanced exposure apparatus is a cylindrical reticle system. The cylindrical reticle system may include a base and a wafer stage group for holding wafers on the base. The wafer stage group may include a plurality of wafer stages moving between a first position and a second position in a circular manner. Further, the cylindrical reticle system may include an alignment detection unit configured above the first position of the base. The alignment detection unit may be utilized to detect stage fiducials on the wafer stage at the first position and the alignment marks on a wafer on the wafer stage at the first position to align the wafer. Further, the cylindrical reticle system may also include a recticle stage on the second position of the base configured to hold a cylindrical reticle, and cause the cylindrical reticle to rate around a central axis of the reticle stage. The cylindrical reticle may be a hollow cylinder, and may have an imaging area and non-imaging areas at both sides of the imaging area. Further, the cylindrical reticle system may also include an illuminator box locating in the hollow cylindrical reticle to irradiate light through imaging area. Further, the cylindrical reticle system may also include an optical projection unit (lens) between the reticle stage and the base. The optical projection unit may be utilized to project the light passing through the imaging area of the cylindrical reticle onto an exposure region on the wafer on the wafer stage. When the wafer on the wafer stage moves from the first position to the second position and performs a unidirectional scan along a scan direction, the cylindrical reticle stage may rotate around the central axis for one cycle, the light passing through the imaging area of the cylindrical reticle may be projected onto the wafer on one wafer stage; and a column of exposure regions of the wafer along the scanning direction may be exposed.

The imaging area of the cylindrical reticle may include transparent regions and opaque regions; and the transparent regions and the opaque regions may form mask patterns. When an exposure light irradiates the imaging area of the cylindrical reticle, the light passing through the transparent regions may be projected onto the photoresist layer on the wafer, thus patterns corresponding to the mask patterns on the cylindrical reticle may be formed in the photoresist layer on the wafer.

The opaque regions of the imaging area of the cylindrical retile are usually formed by forming an opaque material layer on the imaging area, followed by etching the opaque material layer. When the opaque material layer is etched, a photoresist layer may often be formed on the opaque material layer. The photoresist layer may also be formed on the non-imaging areas of the cylindrical reticle. The photoresist layer formed on the non-imaging areas may contaminate the wafer stages of the cylindrical reticle apparatus. Thus, it may need a method to completely remove the photoresist layer formed on the end edges of the cylindrical retile.

FIG. 1 illustrates a cylindrical reticle having a photoresist layer. As shown in FIG. 1, the cylindrical reticle 104 includes a middle imaging area 43 and two non-imaging areas 41 at both sides of the imaging area 43. After forming a photoresist layer 109 on the cylindrical recticle 104, the imaging area 43 of the cylindrical reticle 104 is covered by the photoresist layer 109. The non-imaging areas 41 and side surfaces 31 of the cylindrical reticle 104 are also partially or completely covered by the photoresist layer 109. In order to form patterns on the cylindrical reticle 104, an exposure process is needed to expose the photoresist layer 109 on the imaging area 43 of the cylindrical reticle 104. Before performing the exposure process, the cylindrical reticle 104 having the photoresist layer 109 has to be installed in the reticle stage of a photolithography apparatus. The photoresist layer 109 on both end edges of the non-imaging areas 41 (may be referred as edge beads) and side surfaces 31 of the cylindrical reticle 104 may contaminate the reticle stage of the photolithography apparatus. Thus, the alignment of the cylindrical reticle 104 may be affected, and the particle contaminations of the photolithography apparatus may be beyond the desired requirements. The disclosed device structures, methods and systems are directed to solve one or more problems set forth above and other problems.

BRIEF SUMMARY OF THE DISCLOSURE

One aspect of the present disclosure includes an edge bead removal apparatus. The edge bead removal apparatus includes a clamping unit configured to clamp a cylindrical reticle and to cause the cylindrical reticle to incline with a pre-determined angle and to rotate around a central axis. The edge bead removal apparatus also includes an edge bead removal solvent nozzle configured to spray an edge bead removal solvent to remove edge beads on both edges of the cylindrical reticle.

Another aspect of the present disclosure includes a method for using an edge bead removal apparatus. The method includes providing a cylindrical reticle having a formed photoresist layer; and clamping the cylindrical reticle to incline downwardly with a pre-determined angle. The method also includes moving an edge bead removal solvent nozzle close to a surface of one end edge of the cylindrical reticle. Further, the method also includes spraying an edge bead removal solvent to the surface of the end edge of the cylindrical reticle to remove a portion of the photoresist layer on the surface of the end edge of the cylindrical reticle.

Other aspects of the present disclosure can be understood by those skilled in the art in light of the description, the claims, and the drawings of the present disclosure.

BRIEF DESCRIPTION OF THE DRAWINGS

FIGS. 3-11 illustrate apparatus structures corresponding to an exemplary edge bead removal process consistent with the disclosed embodiments; and FIG. 12 illustrates an exemplary edge bead removal process consistent with the disclosed embodiments.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
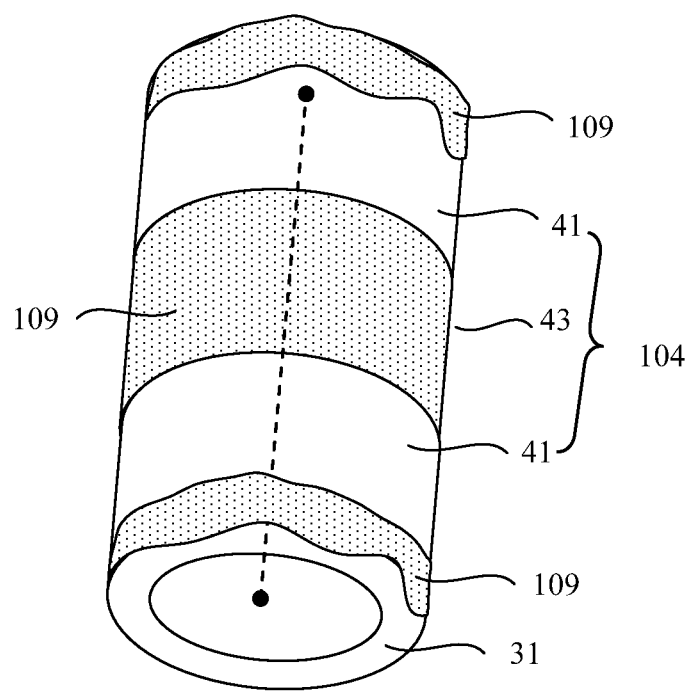
FIG. 1 illustrates a cylindrical reticle with a photoresist layer.
Figure 2:
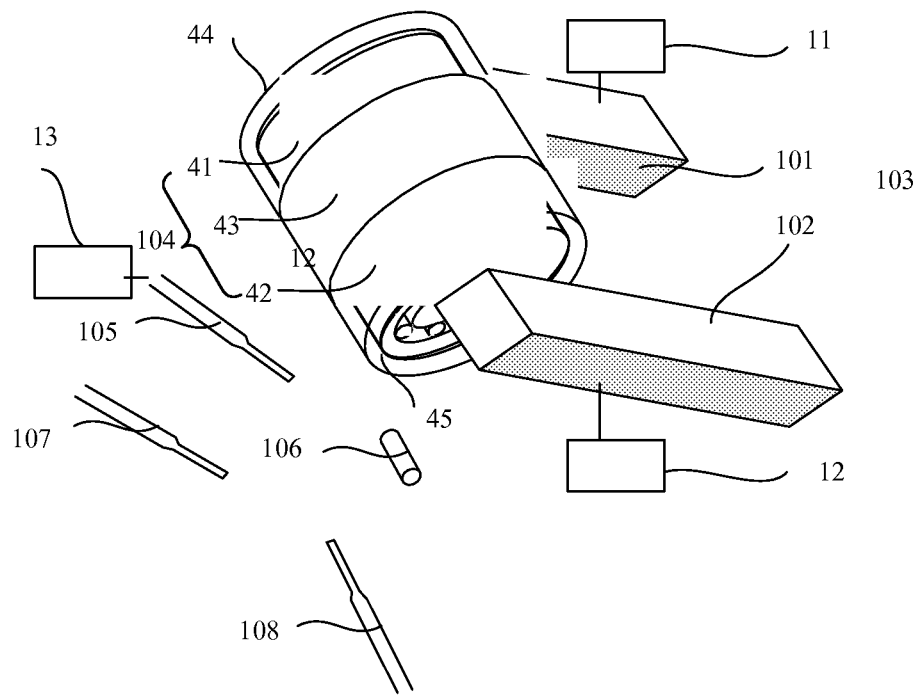
FIG. 2 illustrates an edge bead removal apparatus consistent with the disclosed embodiments.

FIG. 2 illustrates an edge bead removal apparatus consistent with the disclosed embodiments.

As shown in FIG. 2, the edge bead removal apparatus may include a clamping unit 103. The clamping unit 103 may be configured to clamp a cylindrical reticle 104; and cause the cylindrical reticle 104 to incline and rotate around a center axis of the cylindrical reticle 104.

The cylindrical reticle 104 may be a hollow cylinder; and a surface of the cylindrical reticle 104 may have an imaging area 43 and two non-imaging areas at both sides of the imaging area 43. The two non-imaging areas may include a first non-imaging area 41 and a second non-imaging area 42. Mask patterns may be formed on the imaging area 43 of the cylindrical reticle 104. The exposure light source of an exposure apparatus may irradiate the imaging area 43; and the mask patterns may be transferred to a photoresist layer on a wafer. The first non-imaging area 41 and the second non-imaging area 42 may be at two ends of the imaging area 43, respectively, thus it may be convenient for the clamping unit 103 to clamp the cylindrical reticle through the non-imaging areas without mechanically damaging the imaging area 43 of the cylindrical reticle 104. Further, referring to FIG. 2, the cylindrical reticle 104 may also have a first side surface 44 and a second side surface 45.

Referring to FIG. 2, the clamping unit 103 may include a first suspending arm 101 and a second suspending arm 102. A shaft (not labeled) may be fixed at one end of the second suspending arm 102. Further, a first bearing (not labeled) and a second bearing (not labeled) may be installed on the shaft. The first bearing may be installed at one end of the shaft near to the second suspending arm 102; and the second bearing may be installed on one end of the shaft far from the second suspending arm 102.

The first bearing and the second bearing may all include a bearing outer ring (not shown), a bearing inner ring (not shown) and rolling elements (not shown) between the bearing inter ring and the bearing outer ring. The bearing inner ring of both the first bearing and the second bearing may be fixed on the shaft. The cylindrical reticle 104 may be installed on the bearing outer ring of the first bearing and the bearing outer ring of the second bearing by a robotic arm. The inner surface of the non-imaging area 42 of the cylindrical reticle 104 may contact with the bearing outer ring of the first bearing and the bearing outer ring of the second bearing. After installing the cylindrical reticle 104 in a recticle stage, when the first bearing and the second bearing rotate around the center axis of the reticle stage, the cylindrical reticle 104 may also rotate around the center axis.

In one embodiment, the first suspending arm 101 may be a movable arm, before installing the cylindrical reticle 104, the first suspending arm 101 may be detached from the shaft. After the cylindrical reticle 104 is installed on the first bearing and the second bearing, the first suspending arm 101 may move back to the shaft, and the first suspending arm 101 may be fixed on the end of the shaft again.

In certain other embodiments, the first bearing and the second bearing may be electromagnetic bearings. The electromagnetic bearing may include a bearing outer ring, a bearing inner ring and coils between the bearing outer ring and the bearing inner ring. The rotation of the bearing outer ring may be precisely controlled by adjusting current distributions of the coils.

Further, the clamping unit 103 may also include a first driving unit 11. The first 11 driving unit may be configured to drive one end of the cylindrical reticle 104 to incline downwardly. The clamping unit 103 may also include a second driving unit 12. The second 12 driving unit may be configured to drive the cylindrical reticle 104 to rotate around the center axis. After a layer of photoresist is coated on the cylindrical reticle 104, the end of the cylindrical reticle 104 which needs an edge bead removal process may be inclined downwardly. When an edge bead on an end edge of the cylindrical reticle 104 is removed, edge-bead removal solutions and edge-bead removal wastes may be unable to affect the photoresist layer on the image area 43 of the cylindrical reticle 104.

Further, as shown in FIG. 2, the edge bead removal apparatus may also include an edge bead removal (EBR) solvent nozzle 105. The EBR solvent nozzle 105 may be configured to spray an edge bead removal solvent to the photoresist layer on the ends of the cylindrical reticle 104; and remove edge beads.

The EBR solvent nozzle 105 may connect with a third driving unit 13. The third driving unit 13 may drive the EBR solvent nozzle 105 to move close to or far away from surfaces of both end edges of the cylindrical reticle 104. That is, when one end of the cylindrical reticle 104 inclines downwardly to a pre-determined position, the third driving unit 13 may drive the EBR solvent nozzle 105 to adjust a distance between the EBR solvent nozzle 105 and the end edge of the cylindrical reticle 104. Such a distance may be used to adjust an amount of the to-be-removed photoresist layer at the end edges (edge beads) of the cylindrical reticle 104.

Further, as shown in FIG. 2, the edge bead removal apparatus may also include a back rinse nozzle 106. The back rinse nozzle 106 may be configured to remove the photoresist layer on the first side surface 44 and the second side surface 45 of the cylindrical reticle 104. The back rinse nozzle 106 may be fixed at a certain position. The back rinse nozzle 106 may also be a movable component.

Further, as shown in FIG. 2, the edge bead removal apparatus may also include a first gas nozzle 107. The first gas nozzle 107 may be configured to spray an inert gas to remove a residue edge bead removal solvent on the surfaces of both end edges of the cylindrical reticle 104. After removing the photoresist layer on the end edge of the first non-imaging area 41 and/or the second non-imaging area 42 by spraying the edge bead removal solvent using the EBR solvent nozzle 105, the residue edge bead removal solvent may be left on surfaces of both ends of the cylindrical reticle 104. The residue edge bead removal solvent may further etch (remove) the photoresist layer. The residue edge bead removal solvent may also contaminate chambers of subsequent processes. Because the edge bead removal solvent may often have a significantly strong volatility, when the inner gas sprayed by the first nozzle 107 is used to remove the residue edge bead removal solvent, a volatilization of the residue edge bead removal solvent may be speeded up, and the residue edge bead removal solvent may be removed with a significantly high speed.

The first gas nozzle 107 may be fixed at a certain position. The first gas nozzle 107 may also be a movable component.

Further, as shown in FIG. 2, the edge bead removal apparatus may also include a second gas nozzle 108. The second gas nozzle 108 may be configured to spray an inert gas to remove the residue edge bead removal solvent on the first side surface 44 and the second side surface 45 of the cylindrical reticle 104.

The second gas nozzle 108 may be fixed at a certain position. The second gas nozzle 108 may also be a movable component.

In one embodiment, the inert gas may be $N_2$. $N_2$ may have a significantly strong chemical stability, thus it may be unable to etch the photoresist layer. Further, $N_2$ may be relative cheap, thus the production cost may be reduced. In certain other embodiments, other appropriate inert gas may also be used.

FIG. 12 illustrates an exemplary edge bead removal process consistent with the disclosed embodiments; and FIGS. 3-11 illustrate apparatus structures corresponding to certain stages of the exemplary edge bead removal process consistent with the disclosed embodiments.

Figure 3:
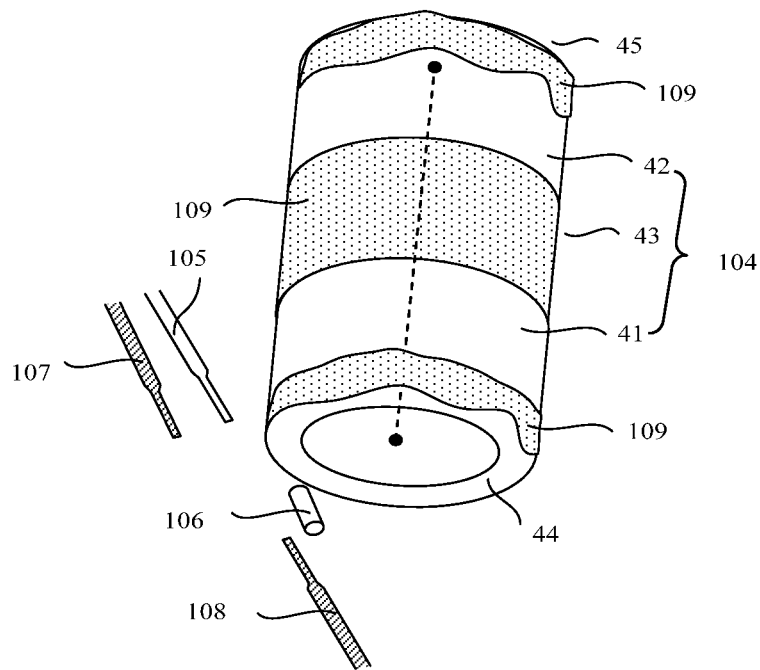

As shown in FIG. 12, at the beginning of the edge bead removal process, a cylindrical reticle having certain structures is provided, and transferred to an edge bead removal apparatus (S101). FIG. 3 illustrates a corresponding apparatus structure.

As shown in FIG. 3, a cylindrical reticle 104 with a photoresist layer 109 is provided. The photoresist layer 109 may cover an entire first imaging area 43. The photoresist layer 109 may also cover entire or partial first non-imaging area 41 and the second non-imaging area 42. A portion of the photoresist layer 109 at the end edge of the first non-imaging area 41 and a portion of the photoresist layer 109 at the end edge of the second non-imaging area 42 may be significantly thicker than other portions of the photoresist layer 109, thus the portion of the photoresist layer 109 at the end edge of the first non-imaging area 41 and the portion of the photoresist layer 109 at the end edge of the second non-imaging area 42 may be referred as edge beads. When the photoresist layer 109 is formed on the cylindrical reticle 104, two side surfaces, a first side surface 44 and a second side surface 45, may also have some residue photoresist.

Various methods may be used to form the photoresist layer 109 on the cylindrical reticle 104. In one embodiment, the photoresist layer 109 is formed by an imprinting method. An apparatus of the imprinting method may include a base; a precision control stage moving reciprocally along a scanning direction on the base; and an imprinting mask. The imprinting mask may have a plurality of trenches; and the trenches may be through the imprinting mask. The trenches may be used to hold a photoresist. The apparatus may also include a photoresist nozzle above the imprinting mask. The photoresist nozzle may be used to spray photoresist on the imprinting mask. Further, the apparatus may include a reticle stage frame. The reticle stage frame may be used to hold a cylindrical reticle; and cause the cylindrical reticle to rotate around a center axis. The reticle stage frame may also be used to move the cylindrical reticle to cause a surface of the cylindrical reticle to contact with a surface of the imprinting mask.

When the trenches of the imprinting mask are full of photoresist sprayed by the photoresist nozzle, the surface of the cylindrical reticle 104 may contact with the surface of the imprinting mask. Then, the precision control stage may move along the scanning direction, and the cylindrical reticle 104 may rotate around the center axis simultaneously. Thus, the photoresist may be coated on the surface of the cylindrical reticle 104.

In certain other embodiments, other appropriate coating apparatus and methods may also be used to form the photoresist layer 109 on the cylindrical reticle 104.

After forming the photoresist layer 109 on the cylindrical reticle 104, the cylindrical reticle 104 having the photoresis layer 109 may be transferred into the disclosed edge bead removal apparatus. A clamping unit of the edge-bead removal apparatus may clamp the cylindrical reticle 104 having the photoresist layer 109. Then, one side of the cylindrical reticle 104 may be inclined downwardly. In one embodiment, as shown in FIG. 3, the first side surface 44 of the cylindrical reticle 104 is inclined downwardly.

Figure 4:
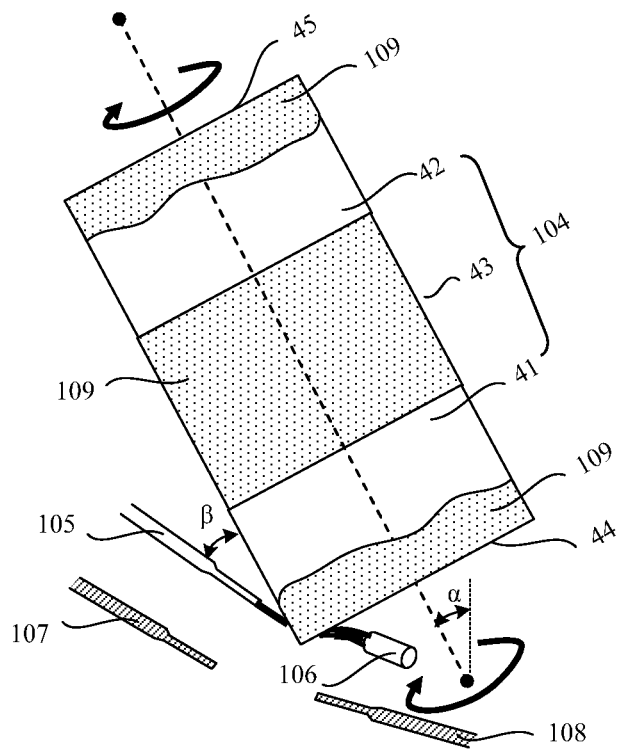

Returning to FIG. 12, after proving the cylindrical reticle 104 with the photoresist layer 109 and transferring the cylindrical reticle into the edge bead remove apparatus, the cylindrical reticle 104 may be moved close to an edge bead removal (EBR) solvent nozzle; and inclined to a pre-determined angle (S102). FIG. 4 illustrates a corresponding apparatus structure.

Figure 5:
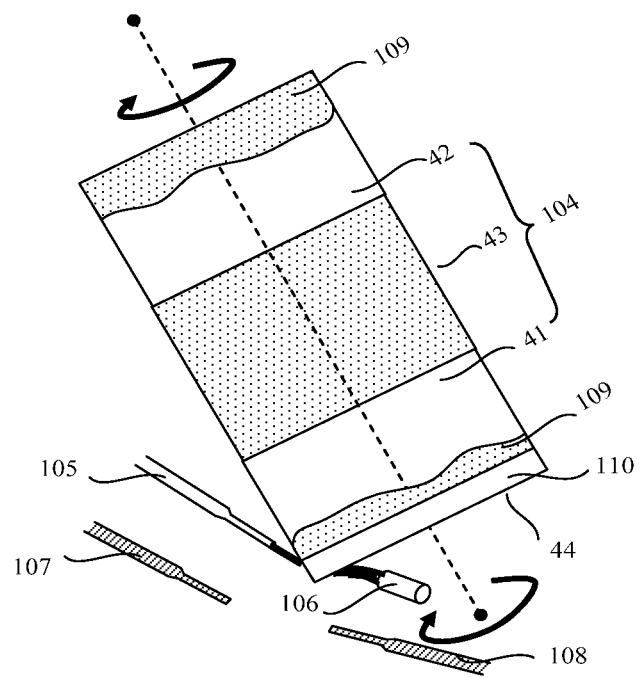

As shown in FIG. 5, the cylindrical reticle 104 with the photoresist layer 109 is moved to an EBR solvent nozzle 105; and the first side surface 44 of the cylindrical reticle 104 with the photoresist layer 109 is inclined downwardly with a pre-determined angle "α". The angle "α" may refer to an angle between the center axis and a vertical direction. The vertical direction may be the direction of the gravity field. When the cylindrical reticle 104 is titled to a pre-determined angle, the gravity force may be utilized to achieve an edge bead removal process.

In one embodiment, the angle "α" may be in a range of approximately 45°~90°. Further, the cylindrical reticle 104 may incline to the EBR solvent nozzle 105, thus, as shown in FIG. 4, an angle "β" between the cylindrical reticle 104 and a spray direction of the spray nozzle 105 may an acute angle. In one embodiment, the angle "β" between the cylindrical reticle 104 and the spray direction of the EBR solvent nozzle 105 may be in a range of approximately 10°~60°.

Referring to FIG. 4, when the EBR solvent nozzle 105 sprays an edge bead removal solvent onto the photoresist layer 109 on the end edge of the first non-imaging area 41 of the cylindrical reticle 104, the sprayed edge bead removal solvent may contact with the surface of the cylindrical reticle 104 along a downwardly inclining angle, thus an upward splashing and/or a back splashing of the edge-bead removal solvent may be prevented. The upward splashing and/or the back splashing of the edge bead removal solvent to the photoresist layer 109 on the imaging area 43 of the cylindrical reticle 104 may affect a uniformity of the photoresist layer 109.

Further, as shown in FIG. 4, after moving the cylindrical reticle 204 close to the EBR solvent nozzle 105 and inclining the cylindrical reticle 104 with a pre-determined angle, the EBR solvent nozzle 105 and a back rinse nozzle 106 may be moved to adjust a distance between the surface of the first non-imaging area 41 of the cylindrical reticle 104 and the EBR solvent nozzle 105 and a distance between the first side surface 44 of cylindrical reticle 104 and the back rinse nozzle 106 to pre-determined values.

Returning to FIG. 12, after moving the cylindrical reticle 204 close to the EBR solvent nozzle 105 and inclining the cylindrical reticle 204 with a pre-determined angle, the photoresist layer 109 on the end edge of the first non-imaging area 41 (edge bead) and the residue photoresist layer 109 on the first side surface 44 may be removed (S103). FIG. 5 illustrates a corresponding apparatus structure.

As shown in FIG. 5, the photoresist layer 109 on a surface 110 of the edge of the first non-imaging area 41 and the residue photoresist layer 109 on the first side surface 44 are removed by spraying an edge bead removal solvent. The edge bead removal solvent sprayed by the EBR solvent nozzle 105 may be used to remove the photoresist layer 109 on the edge of the first non-imaging area 41 (may be referred to an edge bead); a surface 110 of an end edge of the cylindrical reticle 104 may be cleaned and exposed. The edge bead removal solvent sprayed by the back rinse spray nozzle 106 may be used to remove the photoresist layer 109 formed on the first side surface 44 of the cylindrical reticle 104. When the photoresist layer 109 on the end edge of the first non-imaging area 41 and the residue photoresist layer 109 on the first side surface 44 are being removed, the cylindrical reticle 104 may rotate around the center axis; and a centrifugal force may be generated to the edge beads. The centrifugal force may aid the used edge-bead removal solvent to leave the surface of the first non-imaging area 41.

The edge bead removal solvent sprayed by the EBR solvent nozzle 105 and the back rinse nozzle 206 may include any appropriate chemicals. In one embodiment, the edge-bead removal solvent is organic solutions. The EBR solvent nozzle 105 and the back rinse nozzle 106 may have significantly small apertures; and a flow of edge bead removal solvent may be precisely controlled. A flow of the edge bead removal solvent of the EBR solvent nozzle 105 may be in a range of approximately 1 ml/min~30 ml/min. Such a flow may reduce a splashing and/or a scattering of the edge bead removal solvent happening on the surface of the first non-imaging area 41 when the edge bead removal solvent contacts with the surface of the first non-imaging area 41 with a moving angle. A flow of the edge-bead removal solvent of the back rinse nozzle 106 may be in a range of approximately 1 ml/min~30 ml/min.

A relative position (displacement) of the EBR solvent nozzle 105 may be used to control a width of the removed edge bead. The gravity force may also be used to control a distance of the removed edge bead from the end edge of the first non-imaging area 41.

When the EBR solvent nozzle 105 and the back rinse nozzle 106 are spraying the edge bead removal solvent, the cylindrical reticle 104 may rotate around the center axis with a constant speed, thus a desired morphology of the photoresist layer 109 not being removed may be obtained. Further, the photoresist layer 109 on the end edge of the first non-imaging area 41 and the residue photoresist layer 109 on the first side surface 44 of the cylindrical reticle 104 may be completely removed, thus a contamination to chambers of subsequent processes caused by the photoresist layer 109 on the end edge of the first non-imaging area 41 and the residue photoresist layer 109 on the first side surface 44 of the cylindrical reticle 104 may be prevented.

In one embodiment, before the EBR solvent nozzle 105 and the back rinse nozzle 106 spray the edge bead removal solvent, the cylindrical reticle 104 may have an accelerating rotation process, when the cylindrical reticle 104 reaches a constant speed, the EBR solvent nozzle 105 and the back rinse nozzle 106 may start to spray the edge bead removal solvent. After the photoresist layer 109 on the end edge of the first non-imaging area 41 and the residue photoresist layer 109 on the first side surface 44 of the cylindrical reticle 104 being completely removed, the cylindrical reticle 104 may have an deceleration process to stop.

Figure 6:
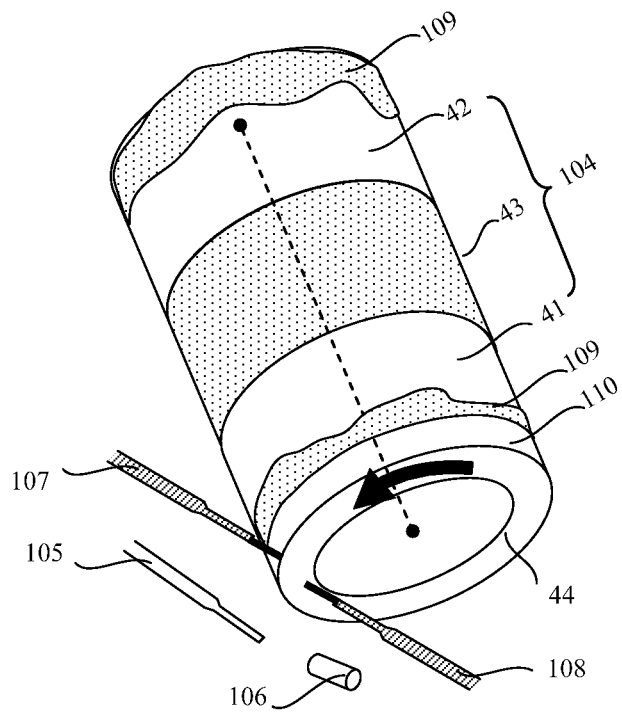

Returning to FIG. 12, after removing the photoresist layer 109 on the edge of the first non-imaging area 41 and the residue photoresist layer 109 on the first side surface 44 of the cylindrical reticle 104, residue edge bead removal solvent may be removed (S104). FIG. 6 illustrates a corresponding apparatus structure.

Referring to FIG. 6, the first gas nozzle 107 may blow an inner gas to remove the residue edge bead removal solvent on the end edge of the first non-imaging area 41. The second gas nozzle 108 may be used to remove the residue edge bead removal solvent on the first side surface 44 on the cylindrical reticle 104.

Specifically, after removing the photoresist layer 109 on the end edge of the first non-imaging area 41 and the residue photoresist layer 109 on the first side surface 44 of the cylindrical reticle 104 by spraying the edge bead removal solvent, the EBR solvent nozzle 105 and the back rinse nozzle 206 may move away from the surface of the first non-imaging area 41 and the first side surface 44. Then the first gas nozzle 107 and the second gas nozzle 108 may move close to the surface of the first non-imaging area 41 and the first side surface 44. Alternatively, the cylindrical reticle 104 may move to cause the surface of the end edge of the first non-imaging area 41 close to the first gas nozzle 107; and the first side surface 44 close to the second gas nozzle 108. When a distance between the first gas nozzle 107 and the cylindrical reticle 104 and a distance between the second gas nozzle 108 and the cylindrical reticle 104 reach a pre-determined value, the first gas nozzle 107 and the second gas nozzle 108 may spray an inner gas to remove the residue edge bead removal solvent.

The inert gas may include any appropriate gas. In one embodiment, the inert gas is $N_2$.

Thus, a process for removing the photoresist layer 109 on the end edge of the first non-imaging area 41 (edge bead) and the residue photoresist layer 109 on the first side surface 44 of the cylindrical reticle 104 may be completed. That is, the edge bead removal of the first non-imaging area 41 may be completed; and the surface 110 of the cylindrical reticle 104 near to the end edge may be completely cleaned.

Figure 7:
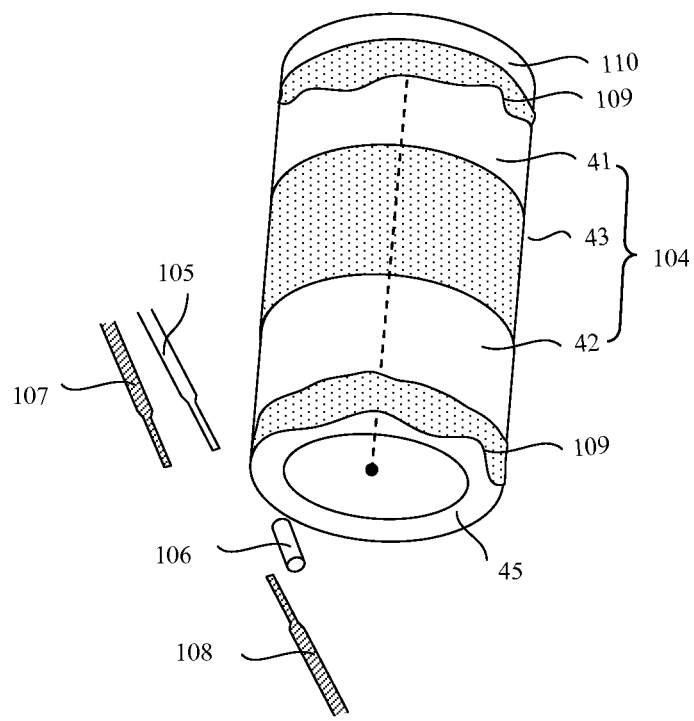

After finishing the edge bead removal process of the first non-imaging area 41 of the cylindrical reticle 104, the cylindrical reticle 104 may be turned over, i.e., 180°. That is, as shown in FIG. 7, a second side surface 45 of the cylindrical retictle 104 is inclined downwardly.

Figure 8:
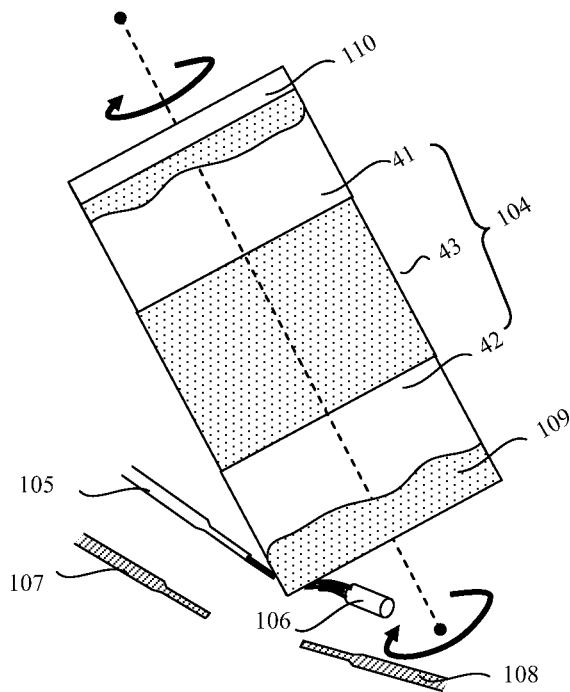

Further, as shown in FIG. 8, the EBR solvent nozzle 105 and the back rinse nozzle 106 may move close to an end edge of the second non-imaging area 42.

Figure 9:
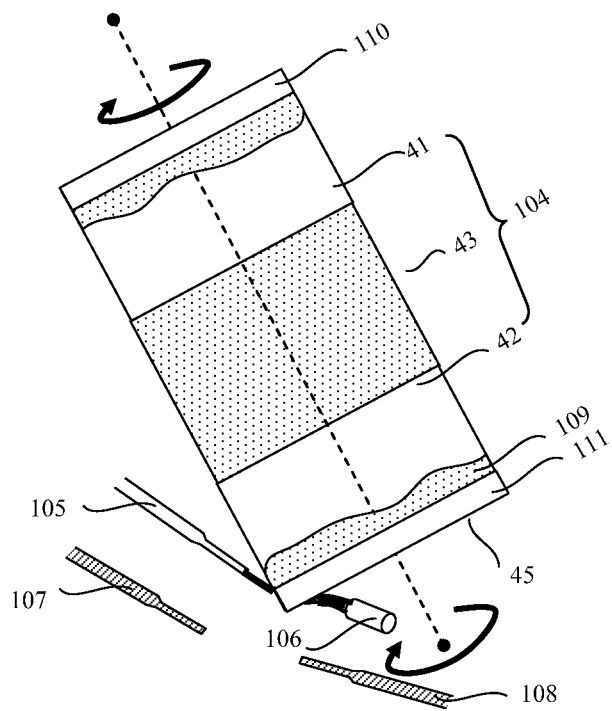

Further, as shown in FIG. 9, the EBR solvent nozzle 105 may spray the edge removal solvent to remove the photoresist layer 109 on a surface of the second non-imaging area 42 near to the end edge (may be referred to an edge bead); and the back rinse nozzle 106 may spray the edge bead removal solvent to remove the photoresist layer 109 on the second side surface 45 of the cylindrical reticle 104. A surface 111 of the non-imaging area 42 near to the end edge may be cleaned and exposed.

Figure 10:
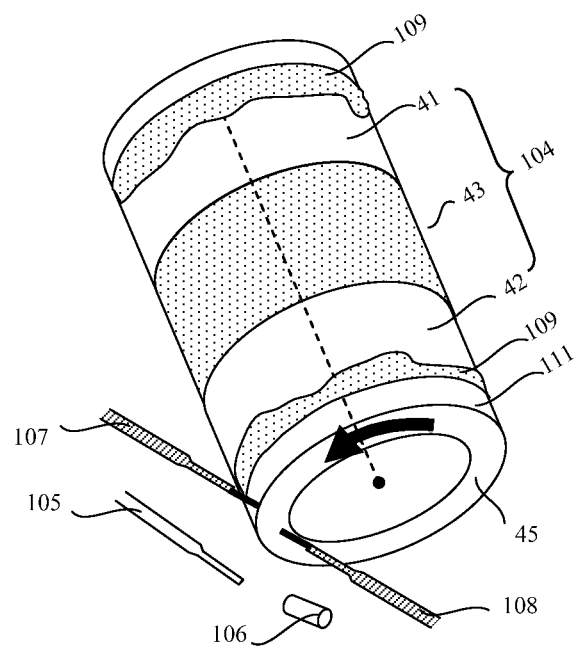

Further, as shown in FIG. 10, the first gas nozzle 107 may spray an inner gas to remove the residue edge bead removal solvent on the surface of the second non-imaging area 42 near to the end edge; and the second gas nozzle 108 may spray the inert gas to remove the residue edge bead removal solvent from the second side surface 45 of the cylindrical reticle 104.

Thus, an edge bead removal process of the second non-imaging area 42 on the cylindrical reticle 104 may be completed.

After the edge bead removal process, the left photoresist layer 109 in the imaging area 43, the first non-imaging area 41, and the second non-imaging area 42 may be exposed. Then, as shown in FIG. 11, the photoresist layer in the first non-imaging area 41 and the second non-imaging area 43 may be completely removed after a developing process. Further, after the developing process, photoresist patterns may be formed in the imaging area 43; and mask patterns may be subsequently formed on the imaging area 43 of the cylindrical reticle 104.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An edge bead removal apparatus, comprising:
   a clamping unit configured to clamp a cylindrical reticle and cause the cylindrical reticle to incline with a non-zero pre-determined angle and to rotate around a central axis, the cylindrical reticle comprising a photoresist layer on a middle portion of an outer circumferential surface of the cylindrical reticle; and
   an edge bead removal solvent nozzle configured to spray an edge bead removal solvent to remove edge beads on two end edges of the outer circumferential surface of the cylindrical reticle, the two end edges of the outer circumferential surface oppositely located adjacent to the photoresist layer.

2. The edge bead removal apparatus according to claim 1, further including:
   a back rinse nozzle configured to spray the edge bead removal solvent to remove a photoresist layer on both side surfaces of the cylindrical reticle.

3. The edge bead removal apparatus according to claim 1, further including:
   a first gas nozzle configured to remove residue edge bead removal solvent on the end edges of the outer circumferential surface of the cylindrical reticle by spraying an inert gas; and
   a second gas nozzle configured to remove residue edge bead removal solvent on side surfaces of the cylindrical reticle by spraying the inert gas.

4. The edge bead removal apparatus according to claim 3, wherein:
   the inert gas is $N_2$.

5. The edge bead removal apparatus according to claim 1, wherein the clamping unit further includes:
   a first suspending arm; and
   a second suspending arm.

6. The edge bead removal apparatus according to claim 5, wherein:
   a shaft is fixed at one end of the first suspending arm; and
   a first bearing and second bearing configured to install the cylindrical reticle are fixed on both ends of the shaft.

7. The edge bead removal apparatus according to claim 1, wherein the clamping unit further includes:
   a first driving unit configured to incline one end of the cylindrical reticle downwardly with the non-zero pre-determined angle.

8. The edge bead removal apparatus according to claim 1, wherein the clamping unit further includes:
   a second unit configured to drive the cylindrical reticle to rotate around the central axis.

9. The edge bead removal apparatus according to claim 1, wherein:
   a third driving unit is connected with the edge bead removal solvent nozzle to drive the edge bead removal solvent nozzle to move close to or away from surfaces of the end edges of the outer circumferential surface of the cylindrical reticle.

10. The edge bead removal apparatus according to claim 1, wherein:
    the cylindrical reticle is a hollow cylinder; and
    the cylindrical reticle has a middle imaging area and two non-imaging areas at both sides of the imaging area.

11. The edge bead removal apparatus according to claim 10, wherein:
    two non-imaging areas at both sides of the imaging area includes a first non-imaging area at a first end edge and a second non-imaging area at a second end edge, and the photoresist layer covers the first and second non-imaging areas.

12. The edge bead removal apparatus according to claim 1, wherein:
    the clamping unit is configured to clamp and turn the cylindrical reticle for about 180°.

13. The edge bead removal apparatus according to claim 1, wherein:
    the non-zero pre-determined angle is in a range of approximately 45°~90°.

* * * * *